United States Patent [19]

Toyozawa et al.

[11] Patent Number: 4,993,618
[45] Date of Patent: Feb. 19, 1991

[54] WIRE BONDING METHOD

[75] Inventors: Kenji Toyozawa, Nara; Takamichi Maeda, Yamatokoriyama, both of Japan

[73] Assignee: Sharp Kabushiki Kaisha, Osaka, Japan

[21] Appl. No.: 386,519

[22] Filed: Jul. 27, 1989

[30] Foreign Application Priority Data

Aug. 5, 1988 [JP] Japan .................................. 63-196375

[51] Int. Cl.⁵ .............................................. B23K 20/10
[52] U.S. Cl. ................................... 228/102; 228/110; 228/111
[58] Field of Search ................ 228/102, 110, 111, 1.1, 228/4.5; 219/56.21, 56.22

[56] References Cited

U.S. PATENT DOCUMENTS

| 4,571,688 | 2/1986 | Kashihara et al. | 228/102 |
| 4,603,802 | 8/1986 | Kurtz et al. | 228/1.1 |
| 4,696,425 | 9/1987 | Landes | 228/102 |

FOREIGN PATENT DOCUMENTS

| 101039 | 5/1985 | Japan | 228/102 |
| 208836 | 9/1986 | Japan | 228/102 |
| 124435 | 5/1988 | Japan | 228/102 |
| 41217 | 8/1988 | Japan | 228/102 |
| 961900 | 9/1982 | U.S.S.R. | 228/102 |

Primary Examiner—Richard K. Seidel
Assistant Examiner—Samuel M. Heinrich
Attorney, Agent, or Firm—Cohen, Pontani & Lieberman

[57] ABSTRACT

A wire bonding method for connecting a pad of a semiconductor chip and an inner lead with a bonding wire, which comprises the steps of pressing a ball formed on an end of the bonding wire to the pad, and applying ultrasonic waves to the ball, while the output of the ultrasonic waves is reduced after a predetermined period of time from the beginning of the step of pressing.

11 Claims, 7 Drawing Sheets

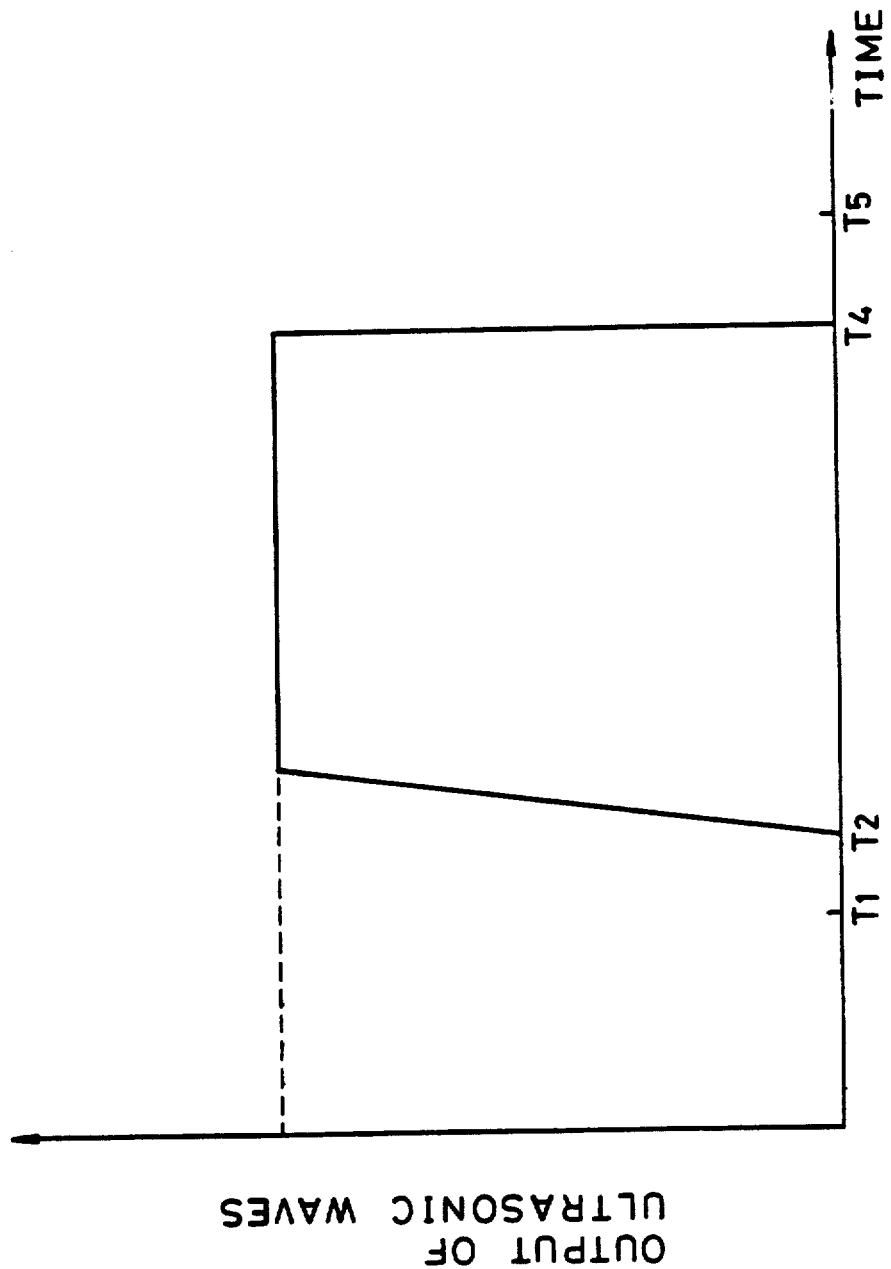

WIRE BONDING METHOD

BACKGROUND OF THE INVENTION

1. Field of the Invention

The present invention relates to a wire bonding method, by which pads of a semiconductor chip and inner leads are connected with bonding wires.

2. Description of the Prior Art

In semiconductor devices, wire bonding is conducted to connect a pad as an electrode of a semiconductor chip with an inner lead such as a lead frame, using a bonding wire such as a gold wire. A conventional apparatus for such wire bonding has a capillary for moving a bonding wire between a pad to be bonded and an inner lead to be bonded second and pressing the bonding wire against the pad and the inner lead, and has a torch for forming a ball on an end of the bonding wire projecting from the tip of the capillary (as in Japanese Patent Laid-Open No. 124435/1988).

On the other hand, the wire bonding can be specifically explained by the following steps as shown in FIGS. 3 and 4. First, a torch forms a ball 31 on an end of a bonding wire 30 (see FIG. 3(a)). A capillary 40 crushes the ball 31 by pressing to it to a pad 11. After the ball 31 is crushed, ultrasonic waves at a constant output are applied to the ball 31 during a period from a time $T_2$ to a time $T_4$ (FIG. 4) with the capillary 40 pressing the ball 31 against the pad 11, so that the ball 31 and the pad 11 are bonded together (see FIG. 3(b)). When the ball 31 is completely bonded to the pad 11, the capillary 40 is moved to a position for bonding an inner lead, where a second bonding is performed. (See FIG. 3(c). The capillary 40 leaves the ball 31 at a time $T_5$ (FIG. 4.). In addition the capillary 40 is vertically moved by a pulse motor or the like.

In the above mentioned wire bonding, the load required for pressing of the ball 31 against the pad may be varied before and after the pressing, as disclosed in Japanese Patent Laid-Open Nos. 101039/1986, 208836/1986 and 41217/1988.

However, such a conventional wire bonding method has disadvantages. For example, when the pad 11 is thin and a metal forming the pad 11 has insufficient hardness, the ball 31 gets into the pad 11 in pressing the ball 31 to the pad 11, and sometimes the ball 31 approaches an insulation oxide film 12 just below the pad 11 as shown in FIG. 5. Since the insulation oxide film 12 has a low mechanical strength, the insulation oxide film 12, a Locos film 14 and the like just below the pad 11 are damaged as, for example, cracked (See 121 of FIG. 5) when strong ultrasonic waves at a constant output are applied under these conditions. This is particularly likely, when a material having a hardness higher than that of gold, such as copper and silver, is used for bonding wire, as the ball more easily gets into the pad. As a result, the interval or spacing between the ball and the insulation oxide film becomes narrow, and ultrasonic waves are directly applied to the insulation oxide film. This causes more serious damage.

SUMMARY OF THE INVENTION

Accordingly, it is an object of the present invention to provide a wire bonding method by which damage such as cracking to an insulation oxide film and the like just below a pad can be avoided.

Particularly, the present invention provides a wire bonding method for connecting a pad of a semiconductor chip and an inner lead with a bonding wire, which comprises the steps of pressing a ball formed on an end of the bonding wire to the pad, and applying ultrasonic waves to the ball, while output of the ultrasonic waves is reduced, after a predetermined period of time from the beginning of the step of pressing.

BRIEF DESCRIPTION OF THE DRAWINGS

FIG. 4 is a timing chart showing ultrasonic waves applied in the prior art; and

DETAILED DESCRIPTION OF THE PREFERRED EMBODIMENTS

A wire bonding method according to the present invention is generally applicable to a manufacturing process of various types of semiconductor devices. Such semiconductor devices include various integrated circuits, operational amplifiers and the like.

In pressing a ball against a pad, load the required for pressing the ball may be constant from the beginning of the pressing, or may be reduced after the ball is crushed to an appropriate thickness.

In applying ultrasonic waves to the ball, output the of ultrasonic waves may be reduced continuously or stepwise.

Figure 1A:
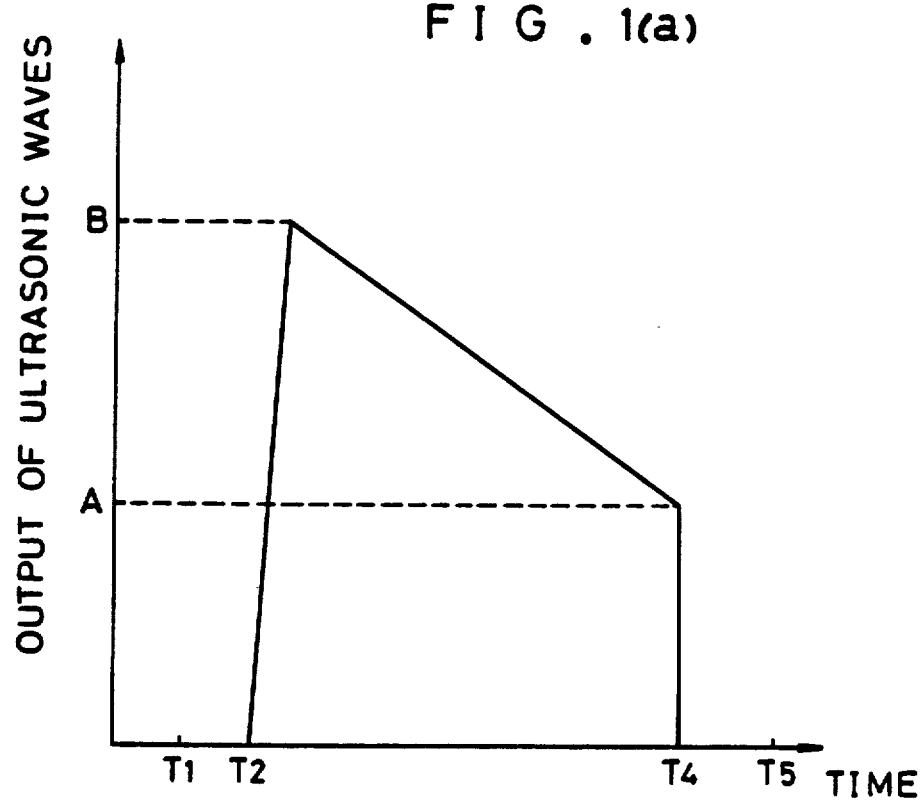
FIGS. 1(a)–(e) are timing charts showing ultrasonic waves applied in a process of wire bonding according to the present invention.
Figure 1B:
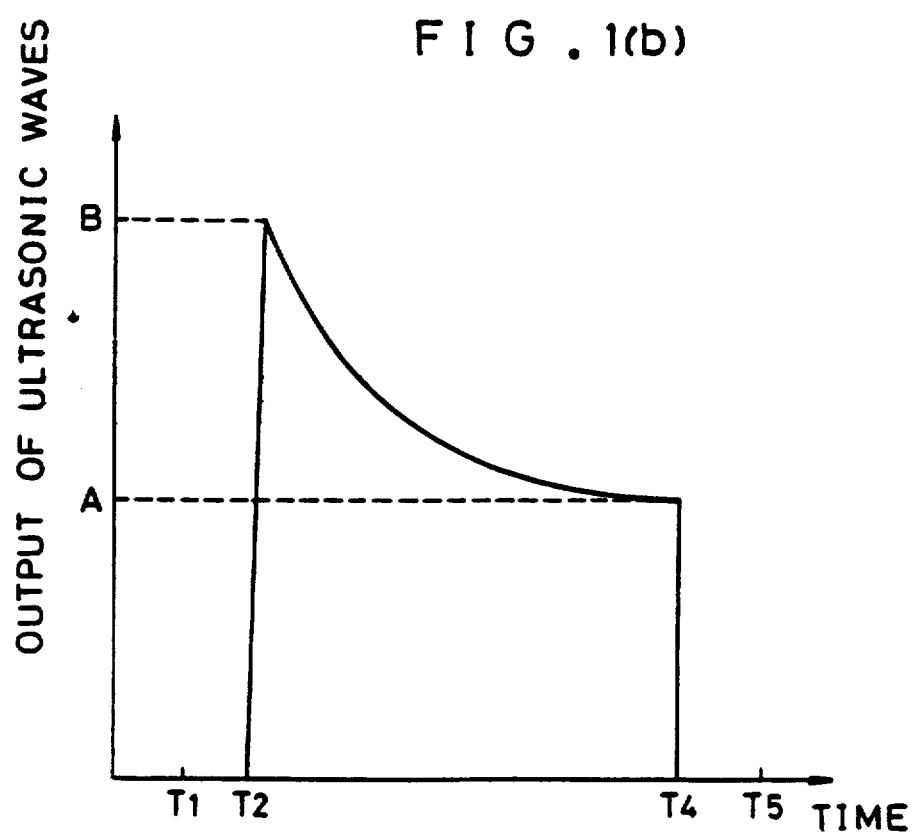
Figure 1C:
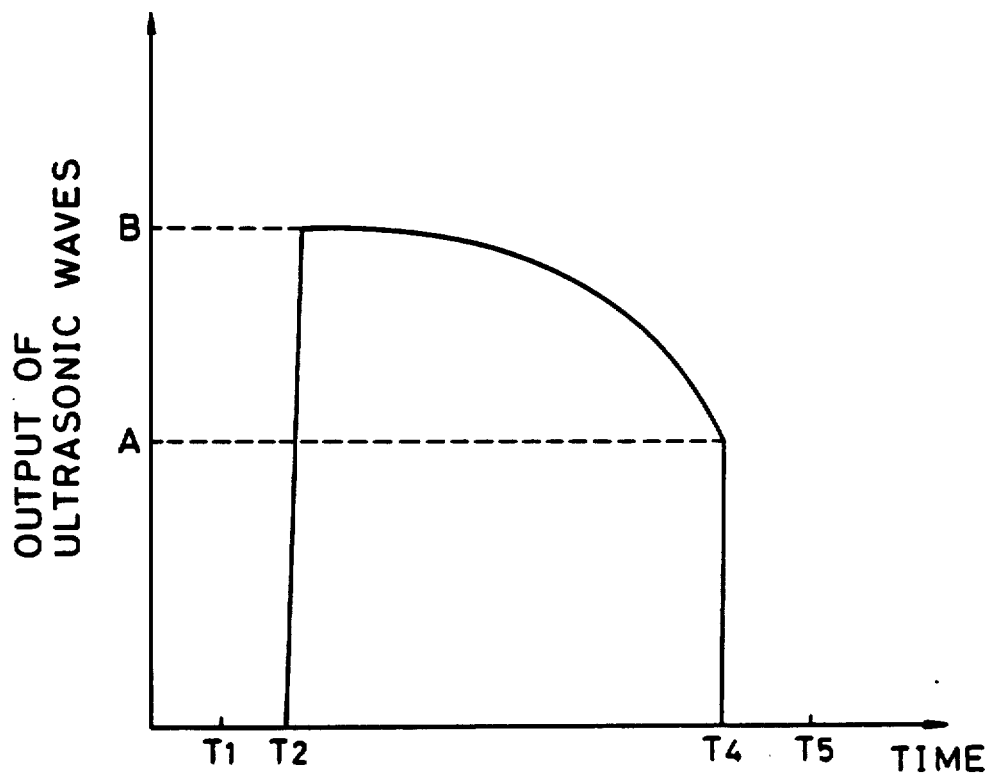
Figure 1D:
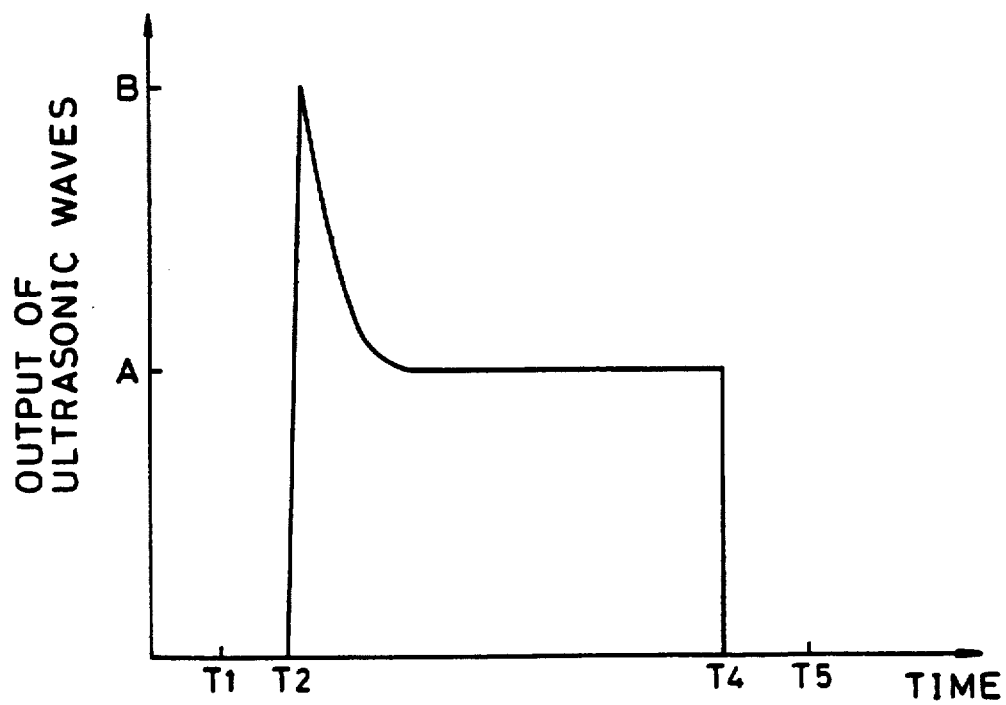

Continuous reduction in the output of ultrasonic waves means that a predetermined value of output of ultrasonic waves is continuously reduced to a value of 1/6-⅜ of the predetermined value, and at that moment output (in other words, oscillation) of ultrasonic waves is stopped. The predetermined value of output of ultrasonic waves, in each case, is in a range where the pad is not cracked and scattered even if ultrasonic waves are applied to a ball which does not get into the pad. The value of 1/6-⅜ of the predetermined value is in a range where the pad is not damaged even if ultrasonic waves are applied to a ball which gets into the pad. There are various ways of continuous reduction in the output of ultrasonic waves, as shown in FIGS. 1(a), (b), (c) and (d). In these figures, A denotes the value of 1/6-⅜ of the predetermined value, and B denotes the predetermined value. Also, these figures include $T_1$ denoting a point when the ball is pressed against the pad of the semiconductor chip, $T_2$ denoting a point when ultrasonic waves are applied to the ball, $T_4$ denoting a point when the output of ultrasonic waves is stopped and $T_5$ denoting a point when the capillary for pressing the ball is raised.

Stepwise reduction in the output of ultrasonic waves means that output of ultrasonic waves is maintained at a predetermined value for a predetermined period of time, and then a value of output of ultrasonic waves is stepwise reduced to 1/6-⅜ of the predetermined value.

Figure 1E:
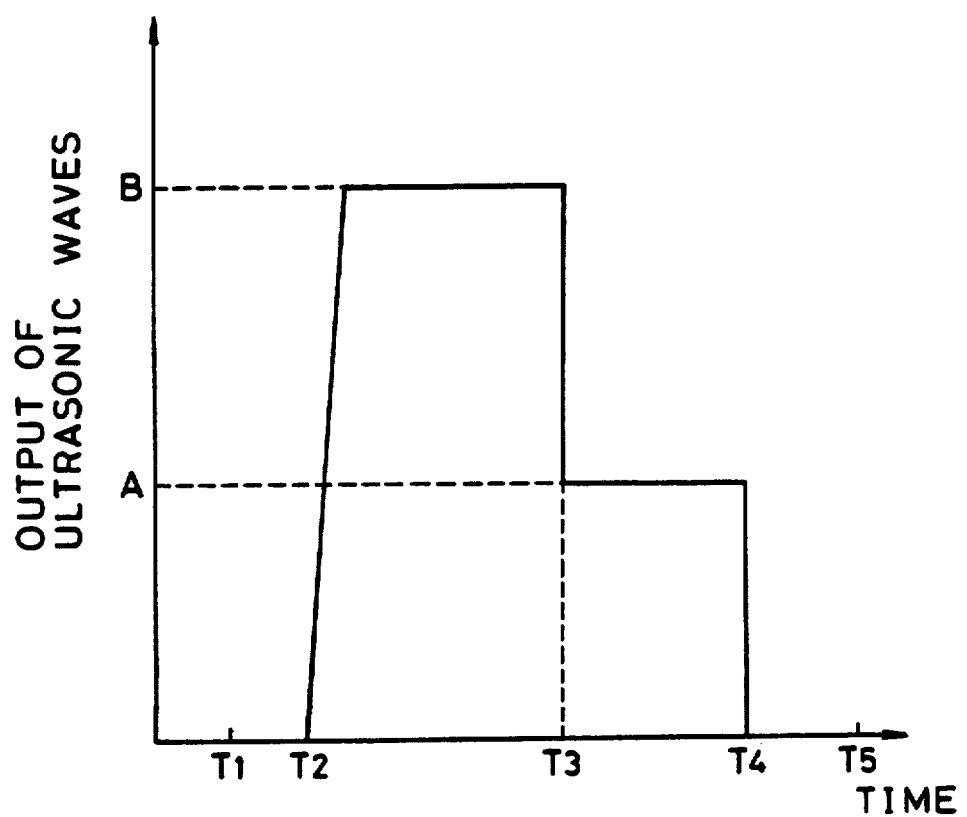

An exemplary way of stepwise reduction in output of ultrasonic waves is shown in FIG. 1(e). In this figure, A, B, and points $T_1$, $T_2$, $T_4$ and $T_5$ correspond to those in FIGS. 1(a)–(d). $T_3$ is a point when output of ultrasonic waves is reduced. A period from the point $T_2$ to the point $T_3$ is a first stage in which a value of output is the predetermined value, and a period from the point $T_3$ to the point $T_4$ is a second stage in which the value of output is 1/6-⅔ of the predetermined value.

In the above statement, the value A may be 40 to 50 (in an arbitrary unit), and the value B may be 70 to 100 (in the arbitrary unit). The period from the point $T_1$ to the point $T_2$ and the period from the point $T_4$ to the point $T_5$ may be set approximately at 5 msec to 30 msec. The period from the point $T_2$ to the point $T_4$ may be set at approximately 10 msec to 45 msec.

A filament, which has a diameter of about 25 μm–35 μm and is made of gold, silver or copper, can be used for the bonding wire in the present invention.

Figure 2:
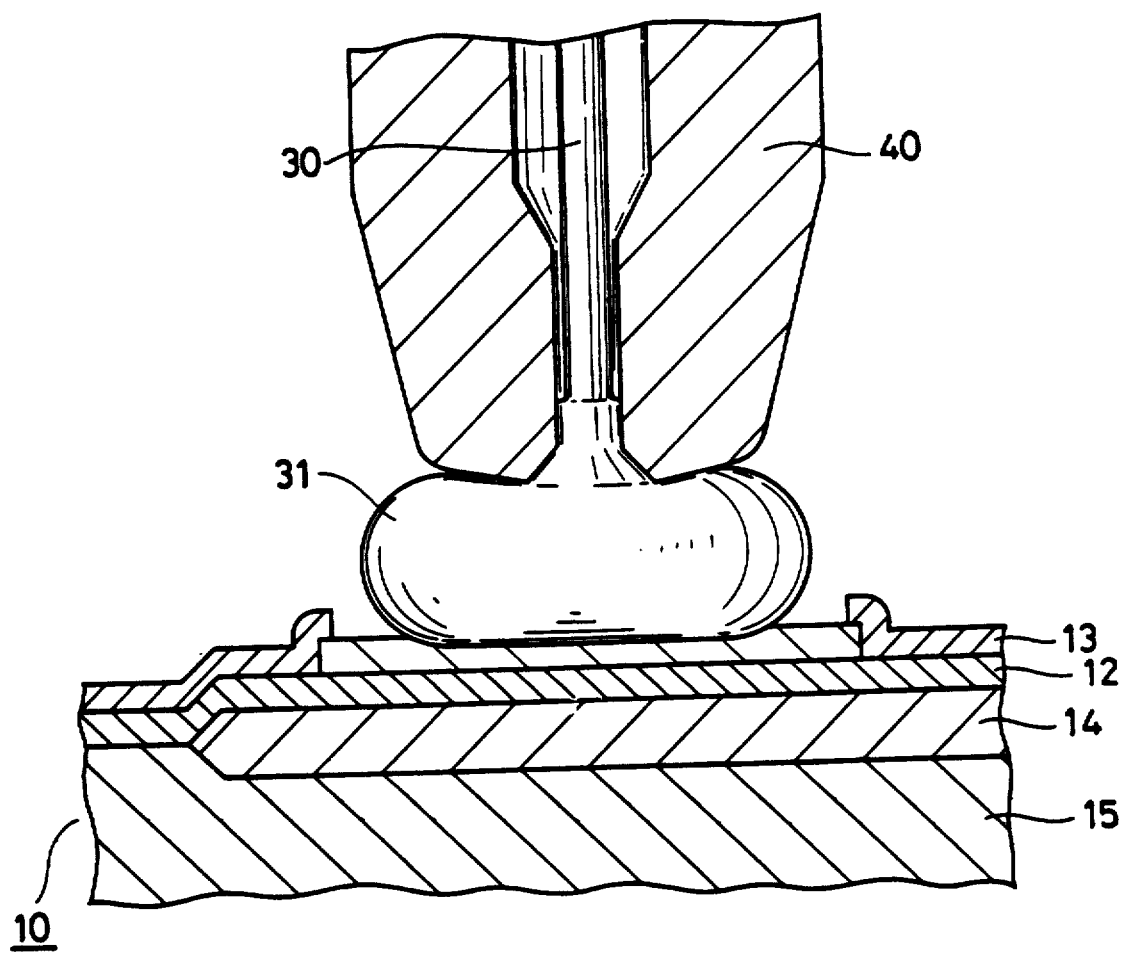
FIG. 2 is a sectional view showing completion of wire bonding.
Figure 3C:
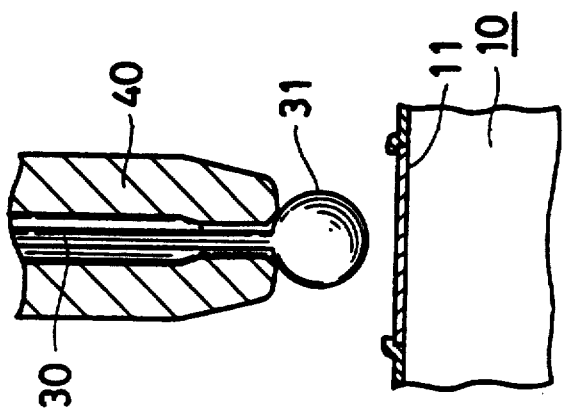
FIGS. 3(a), 3(b) and 3(c) are views showing the steps in a prior art process of wire bonding.
Figure 3B:
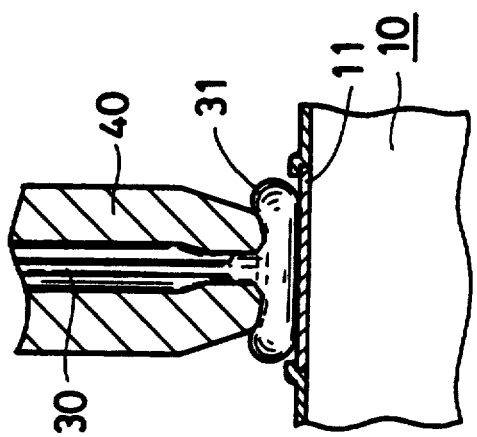
Figure 3A:
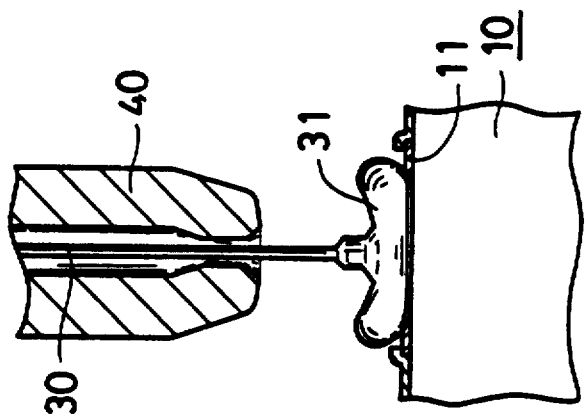
Figure 5:
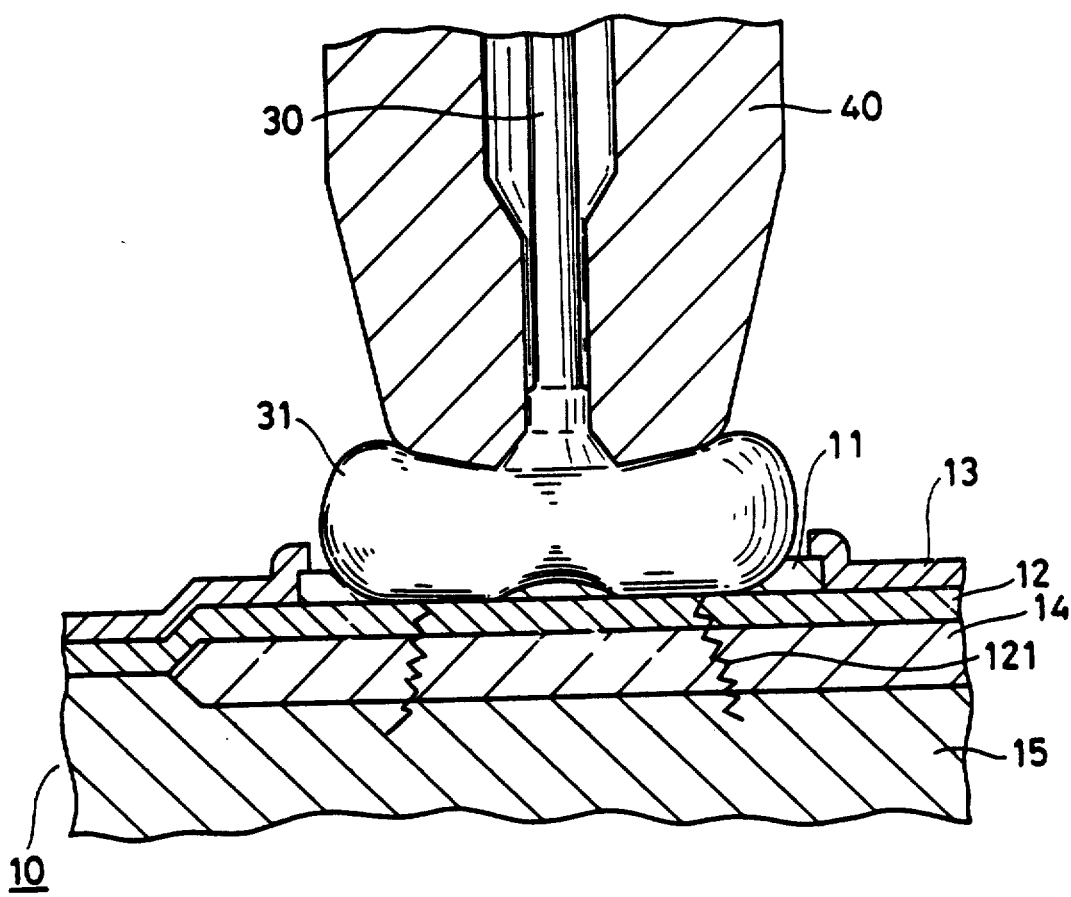
FIG. 5 is a sectional view showing a disadvantage in the use of prior art methods.

FIG. 2 is a view showing wire bonding in a process according to the present invention. Parts corresponding to those used in the above-mentioned prior art process are designated with like reference numerals for convenience of the explanation.

In accordance with the present invention, a pad 11 of a semiconductor chip 10 and an inner lead are connected with a bonding wire 30. A ball 31 is formed on an end of the bonding wire 30, and an output of ultrasonic waves applied to the ball 31 is reduced while the ball 31 is pressed against the pad 11.

An example of a construction of the semiconductor chip 10 in which the wire bonding method according to the present invention is employed will now be explained.

The semiconductor chip 10 is formed by overlaying a Locos film 14, insulation film 12 and passivation film 13 sequentially on a silicon substrate 15. The pad 11 as a first position to be bonded is formed in an opening of the passivation film 13.

According to the present invention, wire bonding is carried out as described below.

First, the ball 31 is formed on the end of the bonding wire 30 by a torch. The ball 31 is pressed against the pad 11 by a capillary 40. Referring to FIG. 1(e), the ball 31 is pressed against the pad 11 at the point $T_1$ shown in FIG. 1(e). At the point $T_2$, about 8 msec later from the point $T_1$, ultrasonic waves are applied to the ball 31.

Output of ultrasonic waves applied to the ball 31, when reduced in two stages as shown in FIG. 1(e), is changed depending upon the material for the bonding wire 30 and the thickness of the pad 11 as shown in Table I.

TABLE I

| No. | Material for the Wire | Aluminum Thickness of the Pad (μm) | Ultrasonic Wave | Output (in an arbitrary unit) | Applying Time (ms) |
|---|---|---|---|---|---|
| 1 | Gold | 1.0 | 1st Stage | 70 (±10) | 10 (±5) |
|  |  |  | 2nd Stage | 45 (±10) | 15 (±5) |
| 2 | Gold | 0.5 | 1st Stage | 80 (±10) | 10 (±5) |
|  |  |  | 2nd Stage | 40 (±10) | 15 (±5) |
| 3 | Copper | 1.0 | 1st Stage | 90 (±10) | 15 (±5) |
|  |  |  | 2nd Stage | 50 (±10) | 20 (±5) |
| 4 | Copper | 0.5 | 1st Stage | 100 (±10) | 15 (±5) |
|  |  |  | 2nd Stage | 40 (±10) | 20 (±5) |

(The diameter of the bonding wire is 25 μm)

Then, the output of ultrasonic waves is stopped at the point $T_4$, and the capillary is raised about 8 msec later from the point $T_4$. Thus, wire bonding to the pad 11 is completed.

According to the present invention, a ball is formed on an end of a bonding wire, and an output of ultrasonic waves applied to a ball is reduced while the ball is pressed against a pad. Therefore, damage such as cracking can be avoided in a insulation oxide film which has an insufficient mechanical strength because of the following reasons:

(1) Immediately after the ball is pressed against the pad, since the ball has not yet gotten into the pad, ultrasonic waves are not propagated to the insulation oxide film formed below the pad even if ultrasonic waves of a high output are applied.

(2) Since the ultrasonic waves have been reduced to a low output even if the ball has gotten into the pad, ultrasonic waves applied to the ball do not bring a crack to the insulation oxide film.

An experiment in which a copper wire having a hardness higher than that of a gold wire is used as the bonding wire in the process of the present invention will now be described. The result of the experiment is obtained by removing the bonding wire with nitric acid after wire bonding, and then etching the pad and silicon substrate below the insulation oxide film with a heated NaOH aqueous solution so as to make any crack in the insulation oxide film noticeable.

In a conventional wire bonding method, a crack is caused in 90% of semiconductor chips when ultrasonic waves at a constant output are applied after a ball is pressed against the pad. Compared to that, it is confirmed that in the wire bonding method according to the present invention, the occurrence of cracking is reduced.

As will be recognized from the result of the experiment, according to the present invention a semiconductor chip of a high reliability is provided since damage such as cracking is rarely occurs due to wire bonding.

Further, when copper or silver having a hardness higher than that of gold is used for the bonding wire, highly reliable and inexpensive semiconductor chips are provided.

What is claimed is:

1. A wire bonding method for connecting a pad of a semiconductor chip and an inner lead with a bonding wire, comprising the steps of:

pressing a ball formed on an end of the bonding wire to the pad; and applying ultrasonic waves to the ball to bond the ball to the pad by:

(A) commencing said applying of ultrasonic waves to the ball at a first amplitude comprising a maximum amplitude at which the ultrasonic waves are applied to the ball in said wire bonding method;

(B) reducing the amplitude at which the ultrasonic waves are applied to the ball from said first amplitude to a second amplitude, wherein said second amplitude is in the range of 1/6 to ⅔ of said first amplitude; and (C) further reducing the amplitude at which the ultrasonic waves are applied to the ball from said second amplitude to substantially zero amplitude in a single stepwise reduction so as to thereby discontinue said applying of ultrasonic waves to the ball.

2. A wire bonding method in accordance with claim 1, wherein said step of commencing the applying of ultrasonic waves to the ball at said first amplitude is initiated at a nonzero time $T_1$ following said pressing of the ball to the pad.

3. A wire bonding method in accordance with claim 1, wherein said step of reducing the amplitude at which the ultrasonic waves are applied to the ball from said first to said second amplitude comprises continuously reducing the amplitude from said first to said second amplitude.

4. A wire bonding method in accordance with claim 1, wherein said step of reducing the amplitude from said first to said second amplitude comprises continuously reducing the amplitude from said first to said second amplitude at a substantially constant rate of change.

5. A wire bonding method in accordance with claim 1 wherein said step of commencing the applying of ultrasonic waves to the ball at said first amplitude is initiated at a time $T_1$, further comprising, between said steps (A) and (B), the step of maintaining the applied amplitude of the ultrasonic waves at said first amplitude from said time $T_1$ until a subsequent time $T_2$.

6. A wire bonding method in accordance with claim 10, wherein said step (B) of reducing the amplitude at which the ultrasonic waves are applied to the ball from said first to said second amplitude comprises reducing the amplitude in a single stepwise reduction so that the amplitude of the applied ultrasonic waves is reduced to said second amplitude at said time $T_2$.

7. A wire bonding method in accordance with claim 6, further comprising, between said steps (B) and (C), the step of maintaining the applied amplitude of the ultrasonic waves at said second amplitude from said time $T_2$ to a subsequent time $T_3$, and said amplitude of the applied ultrasonic waves being further reduced to substantially zero at said time $T_3$.

8. A wire bonding method in accordance with claim 1, wherein said step of reducing the amplitude at which the ultrasonic waves are applied to the ball from said first to said second amplitude comprises gradually reducing the amplitude from said first to said second amplitude.

9. A wire bonding method in accordance with claim 1, wherein said step of reducing the amplitude from said first to said second amplitude comprises gradually reducing the amplitude from said first to said second amplitude at a substantially constant rate of change.

10. A wire bonding method in accordance with claim 1, wherein said step of reducing the amplitude at which the ultrasonic waves are applied to the ball from said first to said second amplitude comprises stepwise reducing the amplitude from said first to said second amplitude.

11. A wire bonding method in accordance with claim 1, wherein said step of reducing the amplitude at which the ultrasonic waves are applied to the ball from said first to said second amplitude comprises reducing the amplitude from said first to said second amplitude in a single stepwise reduction.

* * * * *